United States Patent [19]

Savarese et al.

[11] 3,708,757

[45] Jan. 2, 1973

[54] OSCILLATOR LOOP INCLUDING TWO DOUBLE VALUED MOSFET DELAY NETWORKS

[75] Inventors: Giuseppe Savarese; Giuseppe Campellone; Bruno DeLuccia; Giovanni Russo, all of Naples, Italy

[73] Assignee: General Instrument Corporation, Newark, N.J.

[22] Filed: July 7, 1971

[21] Appl. No.: 160,307

[52] U.S. Cl. .............331/57, 331/108 B, 331/108 D, 331/111, 331/135

[51] Int. Cl. ..............................................H03k 3/28

[58] Field of Search.....331/57, 108 B, 108 C, 108 D, 331/111, 113 R, 135

[56] References Cited

UNITED STATES PATENTS 3,562,559 2/1971 Rapp............................331/113 R X

*Primary Examiner*—Roy Lake
*Assistant Examiner*—Siegfried H. Grimm
*Attorney*—Maxwell James et al.

[57] ABSTRACT

An MOS oscillator is disclosed in which a pair of delay networks are provided, each having two inputs and two outputs, each network having the operating characteristic that a change in one of its inputs in a given sense produces a change in its outputs in a relatively short time and a change in the other of its inputs in that given sense produces a change in its outputs in a relatively long time, the two networks having their inputs and outputs cross-connected. The networks may be formed of MOS devices, all of them on a single substrate. From such a network two sets of outputs are obtained, one set being in the form of complementary pulses and the other set being in the form of complementary square waves. The frequency of operation of the oscillator can be controlled by varying the voltage applied to MOS devices in the circuit which function as resistors, thereby modifying the time constant of capacitor-charging circuits in which those resistors are present.

19 Claims, 4 Drawing Figures

| | t = 0 | t = D | t = D+d | t = D+2d | t = 2D+2d |
|---|---|---|---|---|---|
| A | 0→1 | 1 | 1→0 | 0 | 0→1 |
| B | 1→0 | 0 | 0→1 | 1 | 1→0 |
| X | 0 | 0→1 | 1 | 1→0 | 0 |
| Y | 1 | 1→0 | 0 | 0→1 | 1 |

INVENTORS
GIUSEPPE SAVARESE
GIUSEPPE CAMPELLONE
GIOVANNI RUSSO
BRUNO DE LUCCIA
BY James and Franklin
ATTORNEYS INVENTORS
GIUSEPPE SAVARESE
GIUSEPPE CAMPELLONE
GIOVANNI RUSSO
BRUNO DE LUCCIA
BY James and Franklin
ATTORNEYS INVENTORS
GIUSEPPE SAVARESE
GIUSEPPE CAMPELLONE
GIOVANNI RUSSO
BRUNO DE LUCCIA
BY James and Franklin
ATTORNEYS

OSCILLATOR LOOP INCLUDING TWO DOUBLE VALUED MOSFET DELAY NETWORKS

The present invention relates to a self-starting oscillator circuit, and in particular to one which can readily be formed on a single substrate, without requiring the use of external circuit elements, and which employs MOS devices.

MOS (metal oxide silicon) field effect transistors are today in very widespread use, particularly in integrated circuits provided on a single substrate of semiconductor material, mostly because of the ease with which such devices can be formed and because of their desirable characteristics, particularly small size and very high speed of response.

While this branch of technology is particularly well received in connection with such circuits as logic networks, memories, and the like, problems have presented themselves in utilizing this area of technology in producing oscillator circuits, and particularly oscillator circuits where the frequency of oscillation can be controlled or adjusted. The only type of oscillator circuitry which has been thought to be practical insofar as MOS technology is concerned is the flip-flop type of circuit, but such circuits have significant drawbacks. Many of them are not self-starting. Most of them dissipate appreciable amounts of power, this in turn causing the production of heat. Most of them require the use of electrical components external of the circuit integrated on a single substrate, and many of them require a capacitor of appreciable size, and the formation of large capacitors in an integrated circuit presents many fabrication problems.

It is the prime object of the present invention to devise an oscillator circuit using MOS devices which avoids all of the above disadvantages. In particular, the oscillator of the present invention is very readily incorporated into an MOS integrated circuit on a substrate on which other associated circuits may also be formed, it is inherently self-starting, it requires no outside elements for its operation, its frequency of operation may readily be varied merely by varying a bias voltage applied to a terminal on the integrated circuit substrate, no large capacitors need be formed on the substrate chip, and the amount of power dissipated by the device is very much less than that which has formerly been thought to be required.

These results are accomplished by utilizing a pair of double-valued time delay networks, each of those networks having a pair of inputs and a pair of outputs, preferably complementary in nature, with the inputs and outputs of the respective networks cross-connected. A double-valued delay network is one in which, when one of the inputs is changed in a given sense, the outputs are varied in a predetermined short time d, whereas when the other input is changed in that given sense it will take a long time D for the outputs to be varied. The output of the first delay network which is affected in the same sense as the input to that network in the aforementioned short time d becomes the "long time" input to the second delay network, and correspondingly the output from the first network which is affected in the opposite sense is connected to the "short time" input to the second network. The outputs from the second network are correspondingly cross-connected to the inputs of the first network. As a result of this mode of interconnection, the outputs from the first network will define a series of complementary pulses and the outputs from the second network will define a series of complementary square waves.

The double-value of the delay effected by the two networks is accomplished, in the circuit here disclosed, by providing a series circuit comprising a pair of FETs with a resistor connected between them, the point between the resistor and the first FET being connected to a capacitor. The two inputs are connected to the gates of the two FETs respectively. When the FET above the resistor is rendered conductive by its input the capacitor will charge quickly. When the first mentioned FET is non-conductive and the second FET is conductive, that capacitor will discharge slowly, its rate of discharge being determined by the value of the resistor interposed between it and the then-conductive FET. Hence appropriate voltage values for the input applied to the first FET will cause the potential of the capacitor-connected point to change quickly, this being the first value (*d*) for the time delay network, whereas actuation of the second set to render it conductive will cause the potential of that point to vary in the opposite sense more slowly, thus producing the second value (D) for the delay of the network. The potential of the point connected between the capacitor and the resistor will constitute one output of the delay network; the other output is preferably the complement of the first output, produced by a suitable inverter stage. It has been found to be desirable to provide one or more inverter stages between the time delay network per se and its ultimate output terminals, thereby to cause the signals at those output terminals to be sharpened, or to change more abruptly.

The resistance which determines the rate at which the capacitor of a given delay network discharges may itself be formed by an appropriately configured FET, in accordance with known technology, and the voltage applied to that FET will determine the effective value of its resistance. This voltage may conveniently be derived from a voltage divider network integrated directly into the same chip on which the delay networks and their interconnections are formed, and that voltage may be varied either by a conventional variable resistor or by applying an externally derived variable voltage to an appropriate point on the voltage divider network.

In the circuit as here specifically disclosed the "given sense" of variation of the input signals which is converted into output signal changes with the double delay value described is considered to be the variation in a positive sense, that is to say, the change in signal from a logic 0 to a logic 1 condition, but this, as will be recognized, is exemplary only, and circuitry could be used which was sensitive to the change of the inputs in the opposite sense if that were desired. The capacitors which are involved in the delay circuits of the instant invention may be in whole or in part those capacitances which are inherent in the construction of MOS devices generally, and in particular the capacitance between the gate and the source or drain. Hence there may be no necessity for forming separate capacitors in the chip substrate, but when such discrete capacitors are to be formed they can be quite small, and hence present no problem in fabrication even in MOS integrated circuits.

In part because all of the active and passive elements of the circuit are formed on the same substrate, and by essentially the same process, and in part because of the electrical and functional interrelationships between the circuit elements, the circuit is exceedingly temperature, process and voltage insensitive. Changes in ambient temperature and changes in the supply voltage for the circuit will have minimal effect on the operation of the circuit, and variations in processing conditions as between one chip and another in the course of manufacture will likewise not produce any significant changes in the operation of the circuitry on the respective chips.

To the accomplishment of the above, and to such other objects as may hereinafter appear, the present invention relates to the construction and mode of operation of an oscillator circuit particularly designed for use in conjunction with MOS FET technology, but not necessarily utilizing that technology, as defined in the appended claims, and as described in this specification, taken together with the accompanying drawings in which:

Although the circuitry of the present invention has been particularly designed for use with MOS technology, and is here specifically disclosed in that connection, it will be understood that it is not necessarily restricted to that area of technology, but that the principles thereof may also be embodied in circuitry using other types of transistors or, indeed, other types of circuitry in a more general sense.

Figures 1, 3:
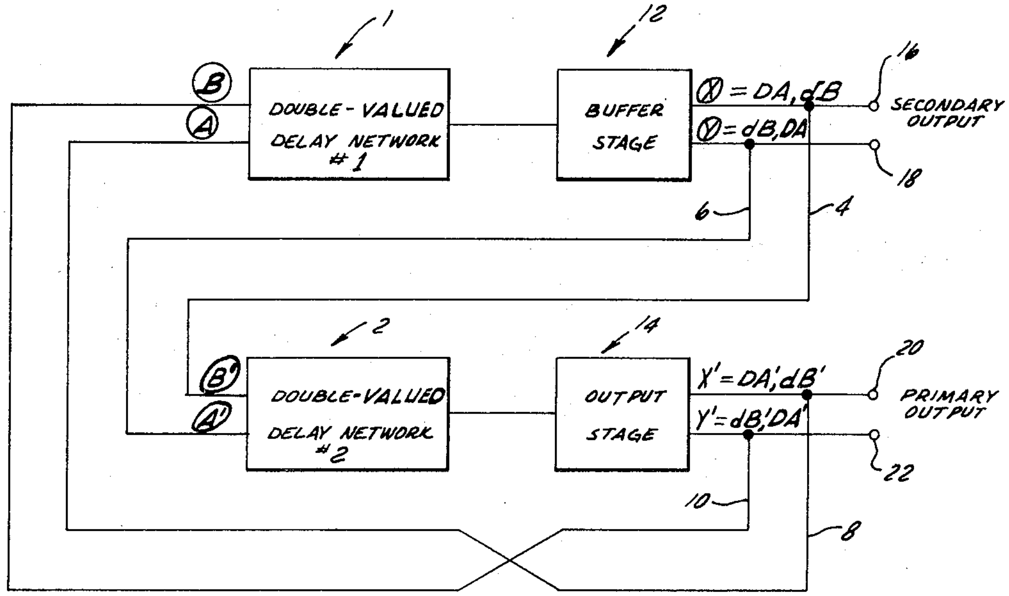
FIG. 1 is a schematic view in block diagram form of the circuit of the present invention.
FIG. 3 is a tabular indication of the time relationship between the various inputs and outputs of the circuit.

As disclosed in the block diagram, FIG. 1, the circuit comprises a pair of double-valued delay networks designated 1 and 2. Each of those networks is provided with a pair of inputs designated A, B and A', B' respectively. Each of those networks has a pair of outputs designated X, Y and X', Y' respectively. The "double-valued" networks 1 and 2 are so constructed that when one of their inputs, e.g., the input A or A', varies in a given sense (in the exemplary circuit here disclosed that "given sense" will be taken to be a change from a logic 0 to a logic 1 value) the outputs of that network will change from one value to another after the passage of a given relatively short period of time designated d, whereas when the other input B or B' varies in that same sense the outputs X, Y or X', Y' will only change after the passage of a period of time D which is greater than, and preferably considerably greater than, the time *d*. These times are, of course, only relatively greater or lesser than one another; in absolute terms they are very short and measured in microseconds. The important factor is that the time *d* is less than the time D. The outputs X and Y from the first delay network 1 are connected, by lines 4 and 6 respectively, to the inputs B' and A' respectively of delay network 2, and the outputs X' and Y' of delay network 2 are connected respectively, by lines 8 and 10, to the inputs A and B of the delay network 1. There is thus a cross-connection between the networks 1 and 2, so that when, for example, the input A varies in the given sense, the output X will change only after time D, the input B' to delay network 2 will change at the same time as the output X from delay network 1, the output Y' from delay network 2 will vary at a time d after the input B' has been changed, the input B to delay network 1 will change at the same time as Y', the output Y from delay network 1 will change a time d after the input B changes, the input A' to delay network 2 will change at the same time as the output Y, the output X' from delay network 2 will vary a time D after A' varies, and the input A to delay network 1 will vary at the same time as the output X'. A comparable chain can be traced starting with the other input B to the delay network 1. Thus it will be seen that the networks are connected in a loop, in which the inputs and outputs are time-related to one another in the fashion described. That time relation, for inputs A and B and for outputs X and Y, at a starting point and at times D, D + *d*, D + 2*d*, and 2D + 2*d* are set forth in FIG. 3.

For reliability of operation, a buffer stage generally designated 12 may be interposed between the delay network 1 and its outputs X and Y, and an output stage generally designated 14 may be interposed between the delay network 2 and its outputs X' and Y'. The buffer stages and output stages may be comprised of inverter networks, and they have the function and effect of sharpening or steepening the rate of response of the outputs relative to the inputs.

With the looped cross-connection of the double-valued delay networks as shown, the outputs X and Y will be in the form of complementary pulses of appreciable width, and the outputs X' and Y' will be substantially in the form of complementary square wave type signals. Thus the network here involved is exceptionally well suited for producing clocking pulses for use with memories, shift registers or other logic networks, and for producing those clock signals by means of circuitry specially suited for being formed in the very same substrate chips on which the logic circuitry itself is formed.

Figure 2:
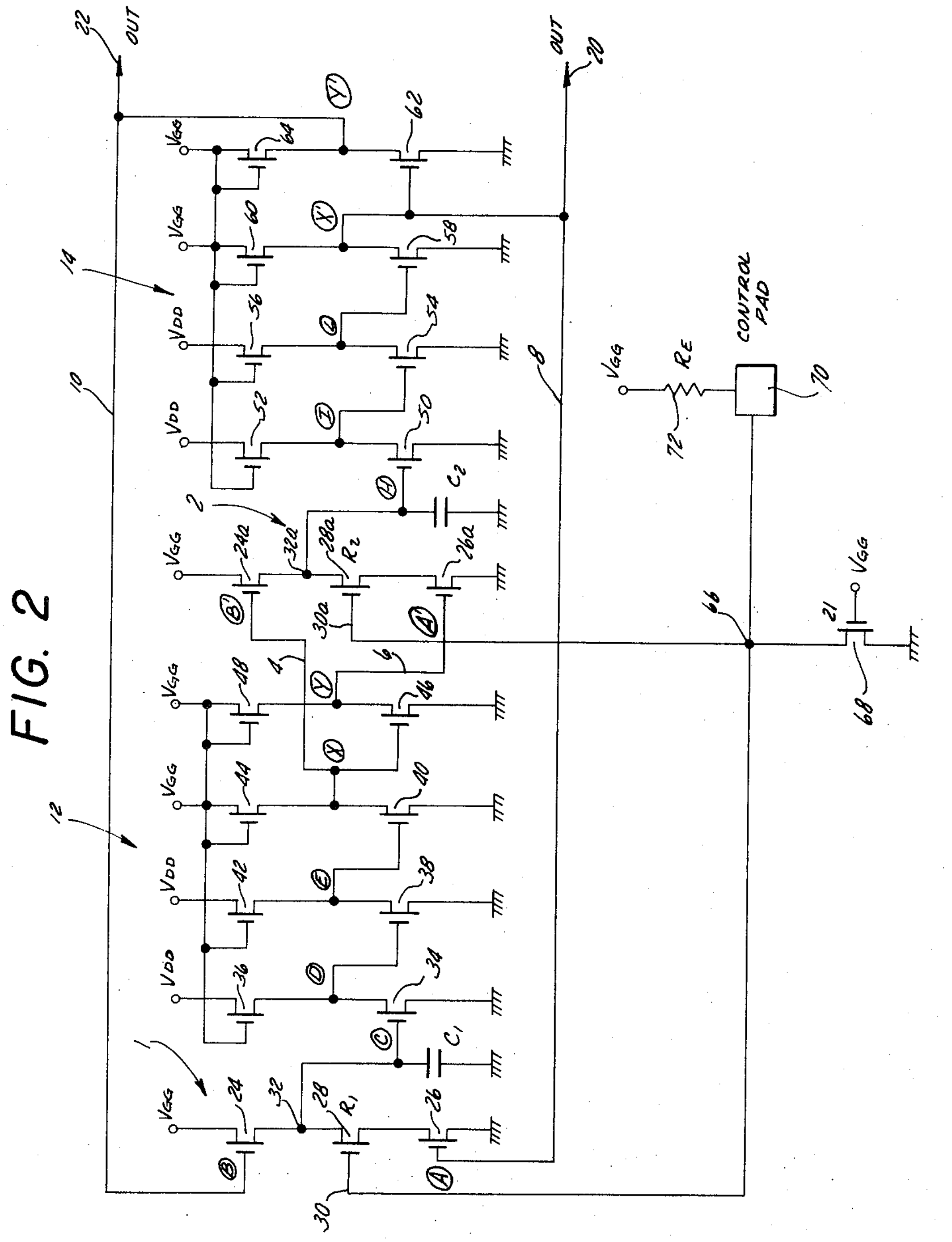
FIG. 2 is a detailed circuit diagram of a particular exemplary embodiment thereof.

A specific embodiment of the generic circuit of FIG. 1 is disclosed in FIG. 2, that embodiment being specially designed for maximum use of MOS technology. The double-valued delay network 1 comprises a series-connected circuit of FET transistor 24, resistor R1 and FET transistor 26. One output terminal of FET transistor 24 is connected to a source of potential $V_{GG}$. The other output terminal thereof is connected via resistor R1 to an output terminal of the transistor 26, the other output terminal thereof being connected to a different voltage level from $V_{GG}$, such as ground. The inputs A and B are connected to the control electrodes (gates) of the resistors 26 and 24 respectively. The resistor R1 is defined by MOS 28 of appropriate geometry of a type well known in the art, the lead 30 applying a potential to the gate of the transistor 28 so as to control the degree of resistance which it exhibits. A point 32 located between the transistor 24 and the resistor R1 is connected to ground via a capacitor $C_1$, and is also connected to the control electrode of a FET transistor 34, one output electrode of which is connected to ground and the other output electrode of which is connected to a voltage source $V_{DD}$ as through transistor 36 the control electrode of which is constantly connected to voltage source $V_{GG}$ so that the transistor 36 comprises a resistor. The node C is connected to the control electrode (gate) of the transistor 34. The capacitor $C_1$ may be constituted by the inherent capacitance between the gate and source of the transistor 34, although a discrete capacitor may be provided in addition to that inherent capacitance.

The double-valued delay of the network 1 comes about in the following fashion. A constant bias is applied to the gate of transistor 28 via line 30, so as to control and fix the resistance value thereof. We have previously arbitrarily defined the "given sense" change of an input as a change from a logic 0 to a logic 1 condition, and for the purposes of explanation of FIG. 2 that will be equivalent to a change effective to render the associated transistor 26 or 24 connected respectively to the inputs A and B to shift from a non-conductive to a conductive condition. These transistors, and the others in the circuit of FIG. 2, are such that they will become conductive when their gates become sufficiently negative relative to the other appropriate output electrodes. Thus, for purposes of explanation, let us assume that the voltage applied to input A shifts from a logic 0 condition (a relatively positive value such as ground) to a logic 1 condition (a voltage negative with respect to ground). At the same time the voltage input B will be shifting in an opposite direction. It formerly was at a log 1 level (negative) and shifts to a logic 0 level (positive). While input B was at a logic 1 level transistor 24 was conductive and capacitor $C_1$ was charged positively. When transistor 26 becomes conductive and transistor 24 becomes non-conductive, by the shift of input A to a logic 1 condition and a shift of input B to a logic 0 condition, a discharge path to ground will be provided for the capacitor $C_1$, that path including the resistor $R_1$, and consequently the capacitor will discharge through that path at a rate determined in part by the resistance value of resistor $R_1$. When, however, the input B changes from a logic 0 to a logic 1 condition and the input A changes from a logic 1 to a logic 0 condition, the capacitor $C_1$ will be recharged, but through a circuit essential devoid of resistance, and hence the recharging of capacitor $C_1$ will be accomplished in a much shorter time than it takes discharging. Thus it will be seen that when the input signal A shifts down from a logic 0 to a logic 1 condition the voltage at node C will change from one value to another over an appreciable period of time determined by the resistance of $R_1$, whereas when it is input B which changes from a 0 to a 1 condition the voltage at node C will return to its initial condition in a much shorter time. The long time is designated D and the short time is designated *d*. Thus the delay circuit is double-valued. It will take a short time d for node C to change from one value to another when it is input B which changes from a 0 to a logic 1 condition, but it will take a long time D for the voltage at node C to shift back when it is input A which shifts from a logic 0 to a logic 1 condition.

Figure 4:
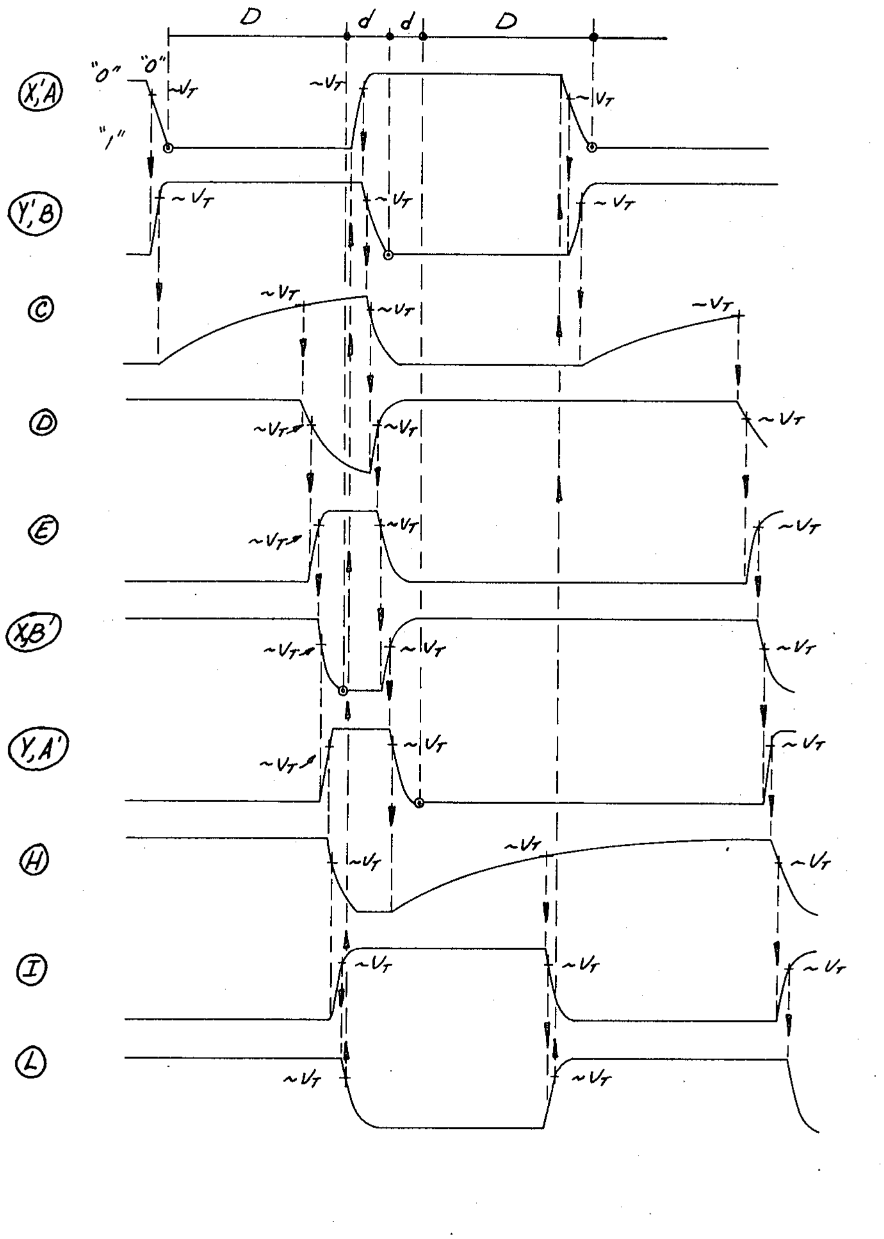
FIG. 4 is a graphical representation of the wave forms present at the indicated nodes of the circuit of FIG. 2.

The FET transistors 34, 38 and 40, in conjunction with the FET transistors 36, 42, and 44 respectively, define inverter stages so that the nodes D, E and X will shift in opposite senses, as shown in the graphical representation of FIG. 4, but with increasingly sharper or abrupt changes of voltage. The FET transistors 46 and 48 constitute an additional inverter stage designed to produce the output Y which is the complement or inversion of the output A. Thus, as may be seen from FIG. 4, when it is input A which goes from logic 0 to logic 1 condition, the time D will elapse before outputs X and Y shift from one output condition to another, output X shifting from a logic 0 to a logic 1 condition and output Y shifting from a logic 1 to a logic 0 condition.

Output X is connected to input B' of delay network 2, which is constructed similarly from a circuit point of view to network 1. Output Y from network 1 is connected to input A' of network 2. Since it is output X which has gone from a logic 0 to a logic 1 condition at time D after the same shift has occurred in input A, input B' to delay network 2 will simultaneously go from a logic 0 to a logic 1 condition. This will cause a shift in node H involving only time d, and that shift will be inverted through FET transistor pairs 50, 52 and 54, 56 and 58, 60, defining inverter stages, so as to produce output X' at the node indicated, this being followed by an inverter stage comprising FET transistors 62 and 64 to produce complementary or inverted output Y'. Output X' and output Y' will shift only a time *d* after input B' shifts from a logic 0 to a logic 1 level. Output X' is connected to input A and output Y' is connected to input B. Consequently the sequence of shifting will continue. The frequency of shifting will be determined by the rate at which the capacitors $C_1$ and $C_2$ of the networks 1 and 2 discharge through resistors $R_1$ and $R_2$ respectively when the transistors 26 and 26*a* of the networks 1 and 2 respectively are rendered conductive.

The connections 30 and 30*a* to the gates of the resistor-transistors 28 and 28*a* respectively are connected to point 66. A FET transistor 68 is connected between that point and ground, the gate of that transistor being connected to an appropriate voltage source such as $V_{GG}$. The point 66 is also connected via control pad 70 formed on the substrate chip and via a resistor 72 to a source of positive potential such as $V_{GG}$. The resistor 72 plus the transistor 68, so biased as to function as a resistor, constitute a voltage divider, with the point 66 being placed at a potential such as to make both of the transistors 28 and 28*a* effective to provide a proper value of resistance, thereby, in conjunction with the value of the capacitances $C_1$ and $C_2$ respectively, to produce oscillations at a particular frequency as determined by the rate at which the capacitors $C_1$ and $C_2$ can discharge through resistors $R_1$ and $R_2$. If it is desired to vary that frequency, some external voltage source can be connected to control pad 70, and by varying the voltage thus applied to the pad 70, the voltage applied to the gates of the transistors 28 and 28*a* can be varied, thereby to change their effective resistances and thus cause the circuit to oscillate at a different frequency.

In FIG. 2 various of the significant nodes have been designated by letters, to wit, A, B, C, D, E, X, Y, A', B', H, I, L, X' and Y'. In FIG. 4 the voltages at those nodes are graphically represented for a complete cycle of operation of the oscillator, with the horizontal coordinate representing time. At the top of FIG. 4 the letters D and d represent the passage of times corresponding to the slow delay and fast delay of the networks 1 and 2. By a comparison between FIG. 2 and the graphical representations of FIG. 4 the voltage variations at each of the nodes can be appreciated and the interrelationship between the operation of the various parts of the circuitry can be understood. In the preceding explanation the threshold voltages of the various transistors have been neglected for purposes of simplicity of discussion, it being well known that MOS transistors of the type in question, when connected in the circuit as disclosed, will become conductive or non-conductive depending upon the relationship between the threshold voltages of the individual units and the difference between the voltage applied to the gate and to the source or drain of that unit. The curves in FIG. 4 illustrate various threshold voltage points, identified by the designation $V_T$.

As may be seen from FIG. 4, the outputs X and Y present at points 16 and 18 on the circuit of FIG. 1 are defined by a pair of complementary pulses, the width of those pulses being related to the time duration 2*d* and the length of time between those pulses being related to twice the time D. Where pulse outputs of this type are desired, those outputs may be taken from the points 16 and 18. The outputs X' and Y', however, are usually much more in demand in logic circuitry, because, as FIG. 4 discloses, they are in the form of complementary square waves. They are obtained at points 20 and 22 of FIG. 1, and can readily be used as clock pulses in associated logic circuitry.

The wave form at node D is perhaps of greatest interest. It will take an appreciable time before the voltage of node D starts to drop from its logic 0 condition, because it takes an appreciable time for the capacitor $C_1$ to discharge sufficiently through resistor $R_1$ to bring the node C to a value such as to cause transistor 34 to start to become conductive. Once node D starts to charge up it will propagate a signal through the remainder of the network and back through network 1 to node C which, in a time approximating twice *d*, will turn transistor 34 off and bring node D back to its logic 0 value. There it will remain until the next time that capacitor $C_1$ starts to discharge and has discharged to a degree sufficient to start to turn transistor 34 on.

The fact that the voltage divider formed by resistor 72 and transistor 68 may well be formed directly on the same substrate chip as the rest of the circuit to a large degree provides inherent compensation for variations in temperature and supply voltage to which the chip may be subjected. Those variations affect the transistors of the delay circuits themselves, but they also affect the voltage divider which provides a voltage bias for resistors $R_1$ and $R_2$, and the effect on those resistors $R_1$ and $R_2$, as defined by MOS transistors 28 and **28*a* respectively, in responding to changes in temperature or voltage supply is such as in large measure to compensate for the effects of those temperature and/or voltage variations on the time delay networks themselves. Thus when a given frequency of operation is selected, the circuit will continue to function at that frequency, or closely at that frequency, even if there should be temperature or control voltage variations. However, to the extent that frequency variation may occur in such instances, it can very readily be cancelled out merely by changing the external voltage bias applied to the control pad 70**.

By means of the cross-connection of the inputs and outputs to the two double-valued delay networks 1 and 2, and by the formation of those networks using MOS technology, a square-wave output oscillator has been produced which is exceptionally well adapted to be incorporated onto a single chip or substrate along with other circuitry in connection with which the oscillator is designed to be used. Thus, to give but one application, the oscillator can be provided on a chip which also includes a memory or a shift register in order to provide complementary square-wave clock inputs to the associated logic circuitry. No starting impulses are required; as soon as the circuit is energized it will start to oscillate. All of the sub-circuits are conductive between ground and the supply voltage source only for minimal periods of time, and hence current consumption and heat production are likewise minimized. The inherent interelectrode capacitance of certain of the transistors involved may be utilized for timing purposes, but if additional capacitance is desired in the delay networks the required capacitance values are sufficiently low so that the requisite capacitors can readily be formed in the substrates without processing difficulties All of the elements required to produce the desired oscillating output may be formed integrally on the chip, and no external circuit components are needed.

While but a single embodiment of the present invention has been here specifically disclosed, it will be apparent that many variations may be made therein, all within the scope of the instant invention as defined in the following claims.

We claim:

1. An oscillator comprising first and second networks having inputs A, B, and A' and B' respectively, and outputs X, Y, and X' and Y' respectively, and each having the operating characteristic that a change in input A or A' in a given sense produces a change in outputs X and Y or X' and Y' respectively in a given sense in a time D and a change in inputs B or B' in said given sense produces a change in outputs X and Y or X' and y' respectively in a time d, where D is greater than d, and electrical connections between X and B', Y and A', X' and A, and Y' and B.

2. The oscillator of claim 1, in which said inputs are complementary and said outputs are complementary.

3. The oscillator of claim 1, in which each of said networks comprises a delay network having said operative characteristic followed by one or more inverter stages, whereby the outputs X, Y and X' and Y' are sharpened.

4. The oscillator of claim 3, in which said inputs are complementary and said outputs are complementary.

5. The oscillator of claim 1, in which each of said networks comprises a series circuit comprising a first voltage source, a first transistor having a control electrode, a resistor, a second transistor having a control electrode and a second voltage source, the inputs of said network being connected to said control electrodes respectively, a capacitor connected between the said second voltage source and a point between said first transistor and said resistor, and means for producing first and second signals corresponding to the potential of said point and to the complement thereof, said first and second signals comprising said outputs.

6. The oscillator of claim 5, in which said signal producing means comprises one or more inverter stages.

7. The oscillator of claim 5, in which said transistors are FETs.

8. The oscillator of claim 7, in which said resistor comprises a transistor having a control electrode, and variable biasing means operatively connected to said control electrode, thereby to vary the magnitude of resistance thereof and hence the frequency of said oscillator.

9. The oscillator of claim 8, in which said resistor-transistor comprises a FET.

10. The oscillator of claim 5, in which said resistor comprises a transistor having a control electrode, and variable biasing means operatively connected to said control electrode, thereby to vary the magnitude of resistance thereof and hence the frequency of said oscillator.

11. The oscillator of claim 10, in which said resistor-transistor comprises a FET.

12. The oscillator of claim 6, in which said transistors are FETs.

13. The oscillator of claim 12, in which said resistor comprises a transistor having a control electrode, and variable biasing means operatively connected to said control electrode, thereby to vary the magnitude of resistance thereof and hence the frequency of said oscillator.

14. The oscillator of claim 13, in which said resistor-transistor comprises a FET.

15. The oscillator of claim 9, in which said biasing means comprises a FET in series with a resistor and connected across a voltage source to define a voltage divider, said control electrode of said resistor-transistor being connected to a point between said biasing means FET and said biasing means resistor.

16. In combination with the oscillator of claim 15, a terminal electrically connected to said point between said biasing means FET and said biasing means resistor and adapted to be connected to an external variable voltage source.

17. The oscillator of claim 7, in which all of said FETs of said first and second networks are formed on a single substrate.

18. The oscillator of claim 9, in which all of said FETs of said first and second networks are formed on a single substrate.

19. The oscillator of claim 11, in which all of said FETs of said first and second networks are formed on a single substrate.

* * * * *